US012536347B1

(12) United States Patent
Bax

(10) Patent No.: US 12,536,347 B1
(45) Date of Patent: Jan. 27, 2026

(54) HELICAL PATTERNING ON A CURVED SURFACE FOR ADDITIVE MANUFACTURING OF A FRAGMENTATION DEVICE

(71) Applicant: Honeywell Federal Manufacturing & Technologies, LLC, Kansas City, MO (US)

(72) Inventor: Megan Elizabeth Bax, Independence, MO (US)

(73) Assignee: Honeywell Federal Manufacturing & Technologies, LLC, Kansas City, MO (US)

( * ) Notice: Subject to any disclaimer, the term of this patent is extended or adjusted under 35 U.S.C. 154(b) by 518 days.

(21) Appl. No.: 17/828,882

(22) Filed: May 31, 2022

(51) Int. Cl.

| | |
|---|---|
| ***G06F 30/17*** | (2020.01) |
| ***B22F 10/80*** | (2021.01) |
| ***B29C 64/386*** | (2017.01) |
| ***B33Y 50/00*** | (2015.01) |
| ***F42B 12/22*** | (2006.01) |
| ***F42B 33/00*** | (2006.01) |

(52) U.S. Cl.
CPC .............. *G06F 30/17* (2020.01); *B22F 10/80* (2021.01); *B29C 64/386* (2017.08); *B33Y 50/00* (2014.12); *F42B 12/22* (2013.01); *F42B 33/00* (2013.01)

(58) Field of Classification Search
CPC .. F42B 12/74; F42B 12/32; F42B 3/28; F42B 27/00; F42B 10/00; F42B 12/00; F42B 14/00; F42B 30/00; F42B 33/00; F42B 1/036; F42B 5/188; F42B 39/00; F42B 99/00; F42B 3/08; G06F 30/17; G06F 30/12; B22F 10/80; B29C 64/386; B33Y 50/00
See application file for complete search history.

(56) References Cited

U.S. PATENT DOCUMENTS

| | | | | |
|---|---|---|---|---|
| 2,184,284 A * | 12/1939 | Coban | F42B 27/00 102/239 |
| 3,498,224 A | 3/1970 | Cordle et al. | |
| 3,566,794 A * | 3/1971 | Pearson | F42B 12/22 102/493 |
| 3,799,054 A | 3/1974 | LaRocca | |
| 4,043,266 A | 8/1977 | Held | |
| 4,106,410 A | 8/1978 | Borcher et al. | |
| 4,106,411 A | 8/1978 | Borcher et al. | |

(Continued)

OTHER PUBLICATIONS

Jr Graves, William T., David Liu, and Anthony N. Palazotto. "Impact of an additively manufactured projectile." Journal of Dynamic Behavior of Materials 3 (2017): 362-376. (Year: 2017).*

*Primary Examiner* — Michael Edward Cocchi
(74) *Attorney, Agent, or Firm* — Erise IP, P.A.

(57) ABSTRACT

Methods of creating geometry for a fragmentation device are presented. The geometry may be generated using computer-aided design tools. An inner body with a curved surface may be generated. An intersection line may be generated on the curved surface by tracing a helical path. A fragment comprising a fragment surface tangent to the curved surface may be generated and aligned with the intersection line. A pattern of fragments may then be generated based on the fragment, the intersection line, and the curved surface. The geometry of the fragmentation device may be stored for manufacture of the fragmentation device by additive manufacturing.

20 Claims, 6 Drawing Sheets

(56) References Cited

U.S. PATENT DOCUMENTS

| | | | | |
|---|---|---|---|---|
| 4,216,720 | A * | 8/1980 | Kempton ................ | F42B 12/32<br>102/494 |
| 4,305,333 | A | 12/1981 | Altenau et al. | |
| 4,312,274 | A | 1/1982 | Zernow | |
| 4,664,035 | A | 5/1987 | Osofsky | |
| 5,337,673 | A | 8/1994 | Koontz et al. | |
| 5,419,024 | A | 5/1995 | Koontz et al. | |
| 6,857,372 | B2 | 2/2005 | Renaud-Bezot et al. | |
| 9,897,425 | B1 | 2/2018 | Hooke | |
| 9,995,562 | B2 | 6/2018 | Jennett et al. | |
| 10,247,531 | B1 | 4/2019 | Hall et al. | |
| 10,520,289 | B2 | 12/2019 | Bootes et al. | |
| 10,578,411 | B2 | 3/2020 | Jennett et al. | |
| 10,627,198 | B2 | 4/2020 | Rovinsky | |
| 10,634,472 | B1 * | 4/2020 | Bonnstetter ............. | F42B 12/32 |
| 10,753,716 | B2 | 8/2020 | Grunder et al. | |
| 11,187,507 | B2 | 11/2021 | Rovinsky | |
| 2014/0230682 | A1 * | 8/2014 | Bonnstetter ............. | F42B 12/26<br>86/53 |
| 2016/0320165 | A1 * | 11/2016 | Rovinsky ................ | F41G 7/001 |

* cited by examiner

HELICAL PATTERNING ON A CURVED SURFACE FOR ADDITIVE MANUFACTURING OF A FRAGMENTATION DEVICE

STATEMENT OF GOVERNMENTAL SUPPORT

This invention was made with government support under Contract No.: DE-NA0002839 awarded by the United States Department of Energy/National Nuclear Security Administration. The government has certain rights in the invention.

BACKGROUND

1. Field

Embodiments of the disclosure relate to a process for designing a helical pattern on a curved surface. More specifically, embodiments of the disclosure relate to a method of designing a helical pattern on a curved surface for additive manufacturing of a fragmentation device.

2. Related Art

Fragmentation devices are generally designed as an outer shell to an expansion device. The outer shell is typically designed and manufactured in patterns to fragment outwardly when the expansion device rapidly expands resulting in an explosive force that fragments the fragmentation device. Generally, it is important for the fragmentation device to fragment in such a way to cover a large area with a greatest number of fragments as possible while still maintaining a minimum ballistic force for each fragment. Therefore, each fragment should maintain a minimum momentum while optimizing for the greatest number of fragments and direction in which the fragments travel.

Historically, fragmentation devices have been manufactured by standard casting and assembly methods; however, with the advent of additive manufacturing, new ways of designing fragmentation devices are being developed. Additive manufacturing has become an efficient method of manufacturing fragmentation devices. Pattern designs for fragmentation devices are typically standard, easy-to-manufacture shapes, such as cylindrical and/or spherical. More complex designs are either not generated for additive manufacturing or are not optimized for performance.

The design of fragmentation devices is important to gain the desired fragmentation results in an efficient manufacturing process. There is a need to design a geometry that provides high numbers of fragments in a geometric shape that provides expected high three-dimensional fragmentation and can be additively manufactured.

SUMMARY

Embodiments of the invention may solve the above-described problems by providing methods for creating geometry for a fragmentation device for manufacture by additive manufacturing. A first embodiment is directed to a method of generating a geometry of a fragmentation device. The method comprises generating a three-dimensional inner body comprising a curved surface, wherein the curved surface comprises curvature in three orthogonal directions, generating an intersection line that traces a substantially helical path along the curved surface, generating a fragment comprising a fragment surface tangent to the curved surface at a point, aligning the fragment with the intersection line at the point, and generating a pattern of fragments on the curved surface based on the fragment and the intersection line.

A second embodiment is directed to a method of generating a geometry of a fragmentation device. The method comprises generating a three-dimensional inner body comprising a curved surface, generating at least one helical path with a specified pitch, generating an intersection line along the curved surface tracing the at least one helical path, generating a fragment comprising a fragment surface tangent to the curved surface at a point, aligning the fragment with the intersection line at the point, generating a helical pattern of fragments from the fragment along the intersection line, and generating a circular pattern of fragments from the helical pattern of fragments on the curved surface.

A third embodiment is directed to a method of generating a geometry of a fragmentation device. The method comprises generating a three-dimensional inner body comprising a curved surface, generating an intersection line that traces a substantially helical path along the curved surface, generating a fragment comprising a fragment surface tangent to the curved surface at a point, aligning the fragment with the intersection line at the point, generating a helical pattern of fragments from the fragment along the intersection line, generating a circular pattern of fragments from the helical pattern of fragments on the curved surface, and storing the geometry of the fragmentation device as computer-readable instructions to be manufactured by additive manufacturing.

This summary is provided to introduce a selection of concepts in a simplified form that are further described below in the detailed description. This summary is not intended to identify key features or essential features of the claimed subject matter, nor is it intended to be used to limit the scope of the claimed subject matter. Other aspects and advantages of the invention will be apparent from the following detailed description of the embodiments and the accompanying drawing figures.

BRIEF DESCRIPTION OF THE DRAWING FIGURES

Embodiments of the invention are described in detail below with reference to the attached drawing figures, wherein.

Figure 1A:
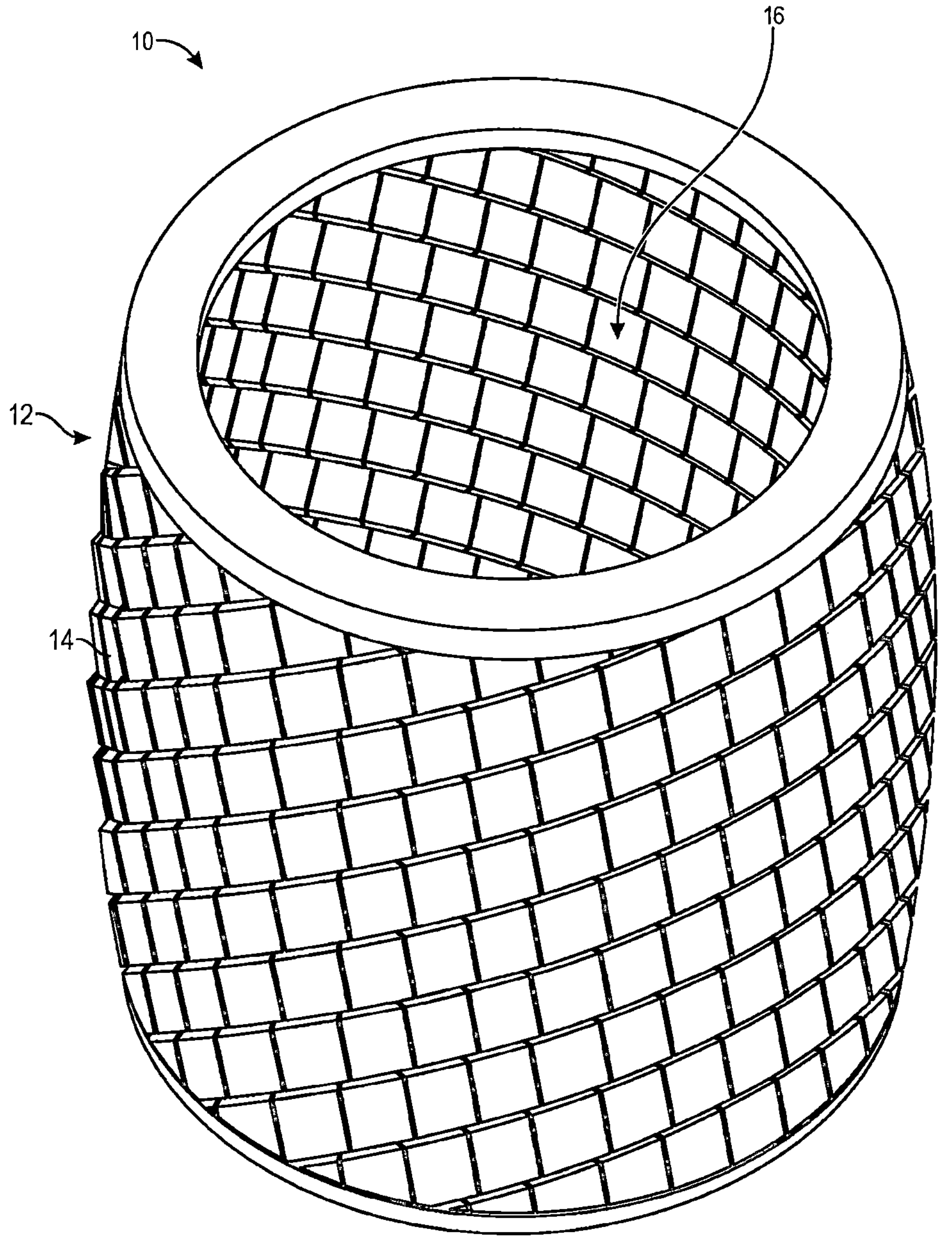
FIGS. 1A-1B depict an embodiment of a fragmentation device.

The drawing figures do not limit the invention to the specific embodiments disclosed and described herein. The drawings are not necessarily to scale, emphasis instead being placed upon clearly illustrating the principles of the invention.

DETAILED DESCRIPTION

The following detailed description references the accompanying drawings that illustrate specific embodiments in which the invention can be practiced. The embodiments are intended to describe aspects of the invention in sufficient detail to enable those skilled in the art to practice the invention. Other embodiments can be utilized, and changes can be made without departing from the scope of the invention. The following detailed description is, therefore, not to be taken in a limiting sense. The scope of the invention is defined only by the appended claims, along with the full scope of equivalents to which such claims are entitled.

In this description, references to “one embodiment,” “an embodiment,” or “embodiments” mean that the feature or features being referred to are included in at least one embodiment of the technology. Separate references to “one embodiment,” “an embodiment,” or “embodiments” in this description do not necessarily refer to the same embodiment and are also not mutually exclusive unless so stated and/or except as will be readily apparent to those skilled in the art from the description. For example, a feature, structure, act, etc. described in one embodiment may also be included in other embodiments but is not necessarily included. Thus, the technology can include a variety of combinations and/or integrations of the embodiments described herein.

Generally, in some embodiments, a method of generating computer-executable instructions for additively manufacturing a fragmentation device are described. In some embodiments, a fragmentation device may be designed to take advantage of the efficient and inexpensive methods of additive manufacturing while maintaining high fragment numbers and efficient fragmentation. Embodiments of the fragmentation device described herein may comprise a plurality of fragments disposed in helical patterns across a curved surface of an inner body. The inner body may be used as a design tool and may not be manufactured. A plurality of fragment layers may be provided in subsequent layers one layer over the previous layer of fragments. The fragment layers may be offset such that each fragment of a layer overlays a gap, or space, between fragments of the previous layer. Therefore, the resulting fragments of the fragment layers are not aligned.

In some embodiments, the fragmentation device may be generated by hand or using computer-aided design (CAD) tools. Either way, the final dimensions and designs may be stored in a format readable for additive manufacturing of the fragmentation device. Though, terms and phrases used herein may align with particular CAD software, but any CAD software may be used. Furthermore, the fragmentation device may be designed for metal manufacturing; however, any material may be used. The designs described herein may not include additional dimensions for error and tolerancing for particular additive manufacturing techniques and programs. It should be understood that any additional dimensions and design tolerances for manufacturing may be incorporated into the described embodiments.

In some embodiments, the geometry of the fragmentation device may be stored as computer-executable instructions. The geometry of the fragmentation device may be saved as a single part for additive manufacturing the entire part as a whole. This saves on tooling costs and assembly of individual parts.

Figure 1B:
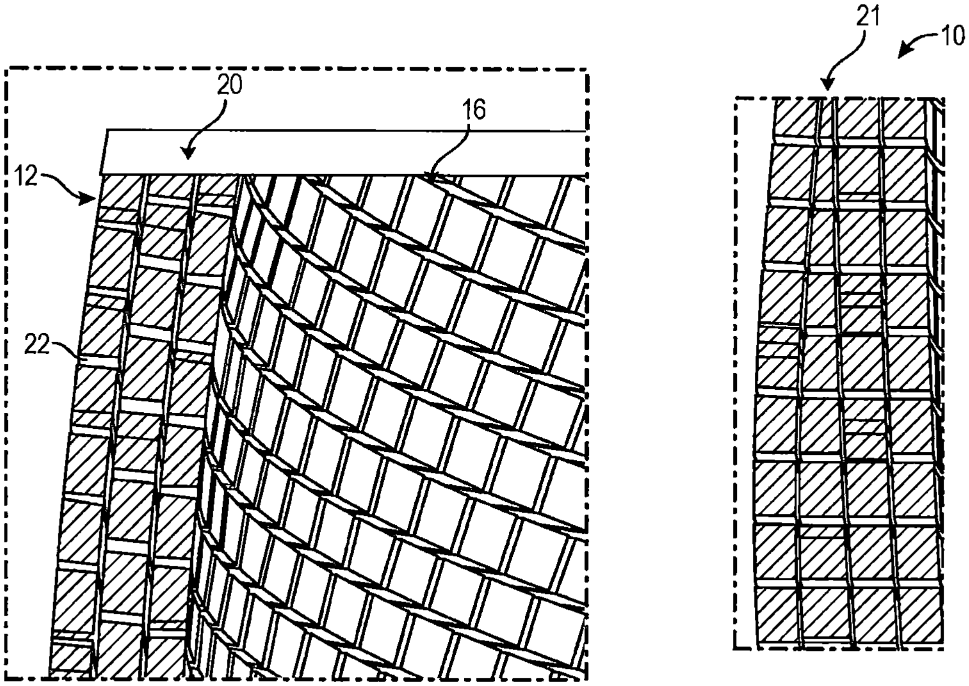

FIGS. 1A and 1B depict an embodiment of an additively manufactured fragmentation device 10. FIG. 1A depicts a perspective view of fragmentation device 10. In some embodiments, fragmentation device 10 may comprise fragments 12 comprising exemplary fragment 14. Fragmentation device 10 may provide fragments 12 in a curved helical arrangement. The curved helical arrangement may provide an efficient pattern for fragment packing and efficient fragmentation. The illustrated design of the geometry of fragmentation device 10 may provide an efficient arrangement of packing such that a relatively great number of fragments 12 may be provided.

In some embodiments, fragmentation device 10 may comprise a hollow inner core 16 for placement of an expansion device (not shown). Fragmentation device 10 may provide the expansion device a shell of fragments 12 that may fragment upon expansion of the expansion device. Fragmentation device 10 may be designed to provide efficient fragmentation in a desired three-dimensional spread when the expansion device expands at a rapid rate from the inner core 16 of fragmentation device 10. Exemplary use cases of fragmentation device 10 may be grenades, rocket propelled grenades, warheads, mines, or any other device that may explosively expand resulting in fragmentation of fragmentation device 10. Additionally, post processing of fragmentation device 10 may provide hooks clamps, drilling, welding, or any other post processing additions that may be necessary for coupling to the expansion device and/or any propulsion devices.

As shown, fragmentation device 10 comprises a series of helical patterns of fragments 12; however, any shape may be achieved. Fragmentation device 10 may be round, cylindrical, oval, or any curved shape, and the methods for generating the geometry of fragmentation device 10 described herein may be utilized to generate any of the described exemplary shapes. The curvature of fragmentation device 10 may be across two orthogonal directions such as in a cylinder, or the curvature may be in three orthogonal directions such as in a circle or in the shape shown, for example. As shown, fragmentation device 10 comprises a curved surface encompassing 360 degrees in a horizontal plane with each end open. In some embodiments, one end may be closed with a cap or with a plurality of fragments. In some embodiments, both ends may be enclosed with a method of opening and closing fragmentation device 10 to add the expansion device later. In some embodiments, fragmentation device 10 may be manufactured around the expansion device and any material that may be added to produce expansion may be added later.

FIG. 1B depicts an embodiment of a cross section of fragmentation device 10. As shown, a plurality of fragment layers 20 presents a shell for the expansion device housed in inner core 16. Plurality of fragment layers 20 may comprise three layers, as shown. In some embodiments, there may be one, two, three, or more than three layers. Furthermore, each layer may be offset from the previous layer such that each fragment of the fragments 12 covers a space or gap 22 between fragments of the previous layer. In this way, fragments from each layer may not be directly aligned radially from the center of fragmentation device 10, radially generally being directed outwardly from the center of fragmentation device 10.

In some embodiments, partial layer 21 may be generated. In some embodiments, partial layer 21 may span a portion of curved surface 26. Partial layer 21 may be disposed between two layers or may represent an interior or exterior layer of fragmentation device 10. Partial layer 21 is discussed in more detail in embodiments below.

In some embodiments, fragments 12 may be any size and any shape that meets the desired fragmentation characteristics. Fragments 12 may be a size based on the material of fragments and expansion properties of the expansion device. Geometries of fragments 12 may be based on simulations of fragmentation where a minimum ballistic fragmentation or a three-dimensional coverage is desired. As such, design of fragmentation device 10, including layers, fragment size, shape, dimension, and the like, may be based on these simulations. In some embodiments, fragments 12 may be round, triangular, quadrilateral, pentagonal, or any other polygon that may result in high fragmentation efficiency and projectile force.

In some embodiments, the material used for manufacturing fragmentation device 10 may be based on ballistic optimization and fragmentation efficiency. For example, expansion force of the expansion device may be known, and fragmentation device may be designed accordingly. The material used for additive manufacturing of fragmentation device may, in some embodiments, be metal, plastic, glass, ceramic, rubber, and may be either lethal upon fragmentation or non-lethal. The material may be assigned in the design of fragmentation device 10 and may be stored in the manufacturing instructions.

Figure 2:
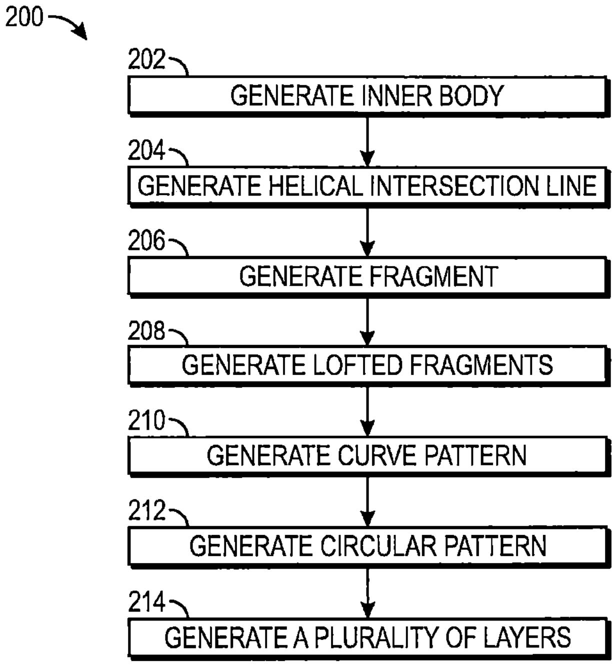
FIG. 2 depicts an exemplary method for generating the geometry for the fragmentation device.

FIG. 2 depicts an exemplary method 200 of generating embodiments of geometry for fragmentation device 10. Various CAD software tools may be used to generate the various graphical entities used to generate the geometry of fragmentation device 10. The geometry of fragmentation device 10 may be output as computer-readable instructions for additively manufacturing fragmentation device 10.

At step 202, inner body 24 (FIG. 3) may be generated as a tool for designing fragmentation device 10. Inner body 24 may be generated as a base for generating fragmentation device 10. Inner body 24 may not be manufactured but may be used to provide curved surface 26 and various tangent lines for placement of fragments 12 for generating fragmentation device 10. Curved surface 26 of inner body 24 may be curved in at least two orthogonal directions of a standard Cartesian coordinate system. Inner body 24 may be generated by various methods using CAD software as described in embodiments below.

At step 204, intersection line 30 (FIG. 4) may be generated. In some embodiments, intersection line 30 may be a helical line projected or traced onto curved surface 26 of inner body 24. Intersection line 30 may provide a helical path traced or projected onto curved surface 26 for placement and alignment of fragments 12.

Figure 7:
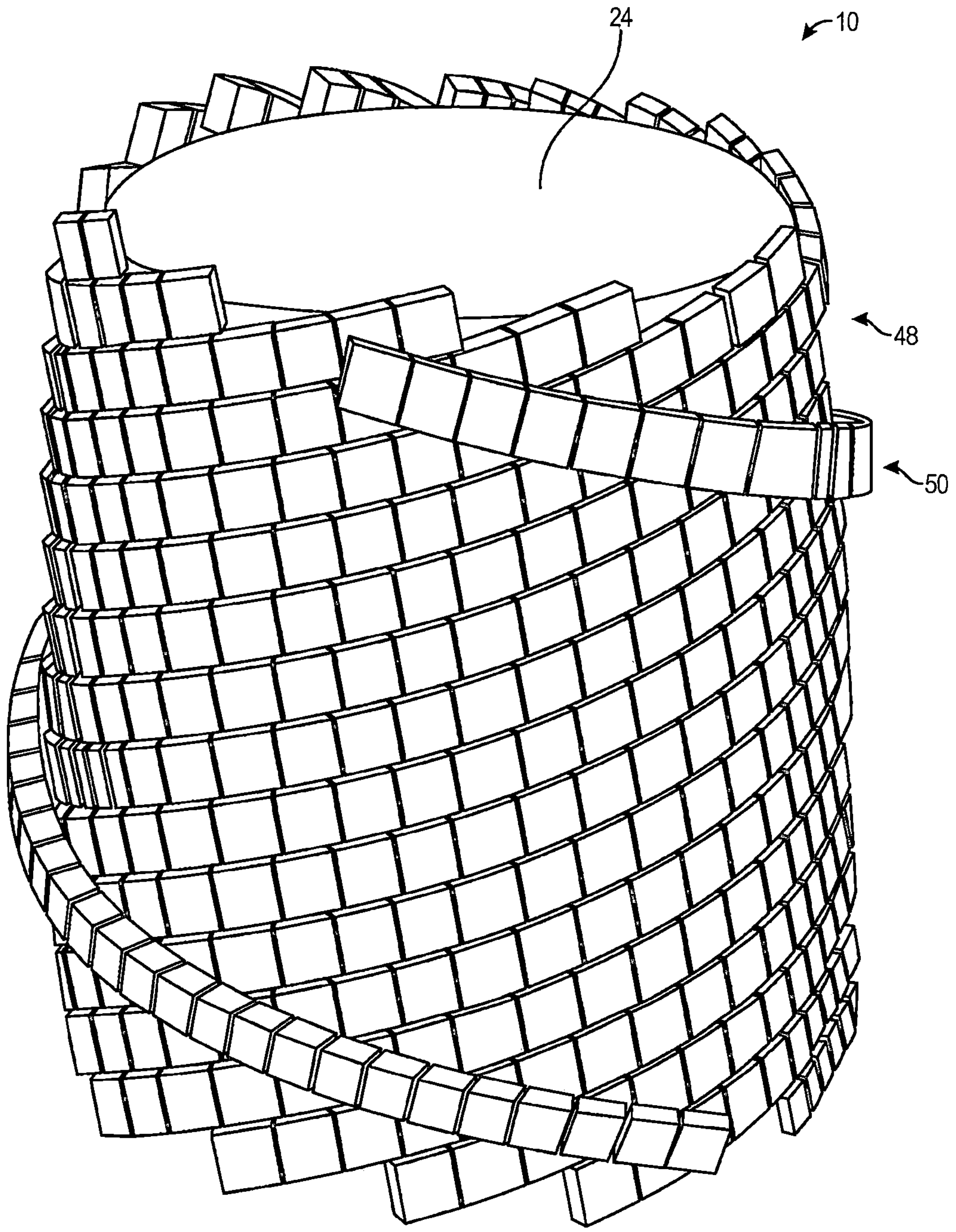
FIG. 7 depicts a plurality of fragment layers of the fragmentation device.

In some embodiments, a plurality of intersection lines may be generated. A plurality of intersection lines may be generated for creating plurality of fragment layers 20. Each intersection line of the plurality of intersection lines may be generated similarly to intersection line 30 described in embodiments below. Each intersection line may provide a helical path on curved surface 26 for placement and alignment of fragments 12 on each layer. Furthermore, each intersection line may be offset from a previous intersection line such that each fragment is disposed over a space between fragments of the previous layer. In some embodiments, each intersection line may be reversed (or angled) from the previous layer such that fragments 12 are placed in an opposite direction as shown in FIG. 7.

At step 206, fragment 36 (FIG. 5A) may be generated. Fragment 36 may be generated by creating a plane with dimensions equivalent to inner surface 40 of fragment 36. The plane may be positioned with the plane center at and tangent to curved surface 26 of inner body 24. Furthermore, the plane may be aligned with edges parallel to intersection line 30.

At step 208, fragment lofts may be generated. In some embodiments, a cross sectional area of fragment 36 as viewed radially from the center of inner body 24 may decrease as the distance increases. The difference in cross sectional area may be referenced as loft. The loft of fragment 36 may decrease to provide extra space between fragments 12 to provide more efficient fragmentation.

At step 210, curved pattern 44 of fragments 12 may be generated. Curved pattern 44 may be generated surrounding inner body 24 with a helical pattern of fragments 12. The helical pattern including the pitch of the helix may be based on curved surface 26 of inner body 24. For example, the greater the curvature of curved surface 26, the greater the pitch of the helix. As long as fragment 36 is aligned with the edges parallel to intersection line 30, the pitch of the helix can vary widely, independent of the curvature of curved surface 26. The pitch of the helix can also be variable along the curved surface 26. In some embodiments, curved pattern 44 may be substantially helical or may be any other curved shape.

At step 212, circular pattern 48 of fragments 12 may be generated to cover inner body 24. In some embodiments, curved pattern 44 of fragments 12 may be selected and copied 360 degrees around inner body 24 providing full coverage of fragments 12 with known dimensions and known spacing. When circular pattern 48 is complete, the geometry for a first layer of fragment patterning is complete.

At step 214, a plurality of layers may be generated as shown by second curved pattern 50. In some embodiments, a plurality of intersection lines may be generated at step 204. Each intersection line of the plurality of intersection lines may be used as a helical path to position fragments 12 in a curved pattern 44 and second circular pattern 52 as described in steps 212 and 214. In some embodiments, fragments 12 from each layer cover the spaces between each fragment of the previous layer. Furthermore, the helical patterns may be reversed from one layer to the next as shown in FIG. 7.

When the geometry of fragmentation device 10 is complete, the geometry may be stored as computer-readable instructions for manufacturing fragmentation device 10 by additive manufacturing. A more detailed description of the methods for generating the geometry of fragmentation device 10 is presented below. The below-described methods for generating the geometry of fragmentation device 10 illustrated in FIGS. 3, 4, 5A-5B, 6, and 7 may be incorporated into method 200.

Figure 3:
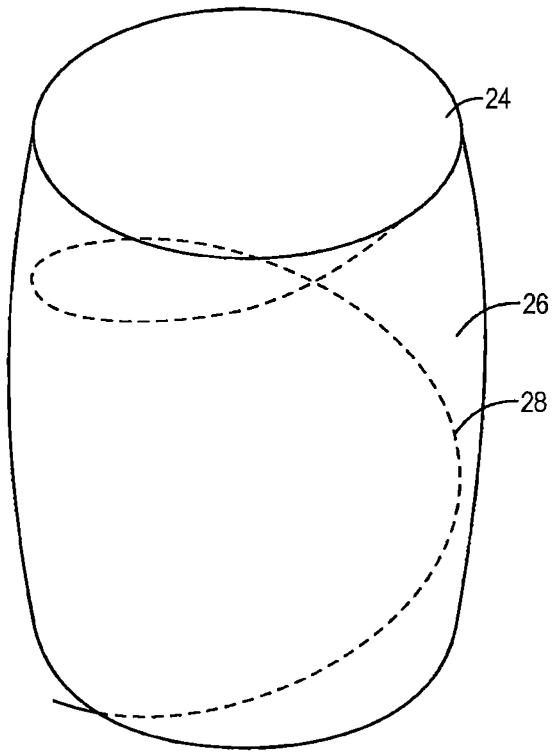
FIG. 3 depicts an embodiment of an inner body presenting a curved surface for generating the geometry of the fragmentation device.

FIGS. 3, 4, 5A-5B, 6, and 7 depict an exemplary geometry of fragmentation device 10 as generated, in some embodiments, by a computer-implemented process. FIG. 3 depicts inner body 24 comprising curved surface 26. Inner body 24 may be generated as a platform for generating curved pattern 44 of fragments 12. Inner body 24 may be any shape comprising curved surface 26. Curved surface 26, as shown, is a convex, or bulging, cylinder; however, curved surface 26 may be any shape including any curvature in two or three orthogonal dimensions. As shown, curved surface 26 comprises curvature in three directions or three planes of a standard Cartesian coordinate system comprising three orthogonal directions; however, in some embodiments, curved surface 26 may comprise curvature in at least two directions. Curved surface 26 may be concave, convex, wavey, irregular, and comprise any constant or varying radius associated with and defining the curvature of curved surface 26.

In some embodiments, inner body 24 may be generated utilizing CAD tools as described above. A sketch may be created to generate inner body 24. Curved surface 26 of inner body 24 may be drafted by drawing a vertical cross-section of inner body 24 utilizing arc and tangent tools of the CAD tools to produce appropriate dimensions of an inner portion of fragmentation device 10. The three-dimensional inner body 24 shown in FIG. 3 may be generated from the described sketch by revolving the sketch by 360 degrees. Inner body 24 may be generated by drawing in three dimensions, extruding, or any other method that may produce inner body 24 as shown. Though the description herein utilizes CAD tools for generating the geometries, any hand-drawn, automatic, or any other method may be used.

Furthermore, FIG. 3 depicts helical path 28. Helical path 28 may be generated at to provide a path along the surface of inner body to position fragments 12 along curved surface 26. Helical path 28 may be generated by generating a sketch on a top surface of inner body 24, defining helix parameters, and generating helical path 28 throughout inner body 24. Helix parameters may comprise a constant or variable pitch, a pitch distance, a height, a start angle, and a direction (e.g., clockwise, or counterclockwise). In some embodiments, the variable pitch may be defined by a mathematical relationship between the curvature of curved surface 26 and the helix. Helical path 28 may be generated as shown using the helix parameters.)

Figure 4:
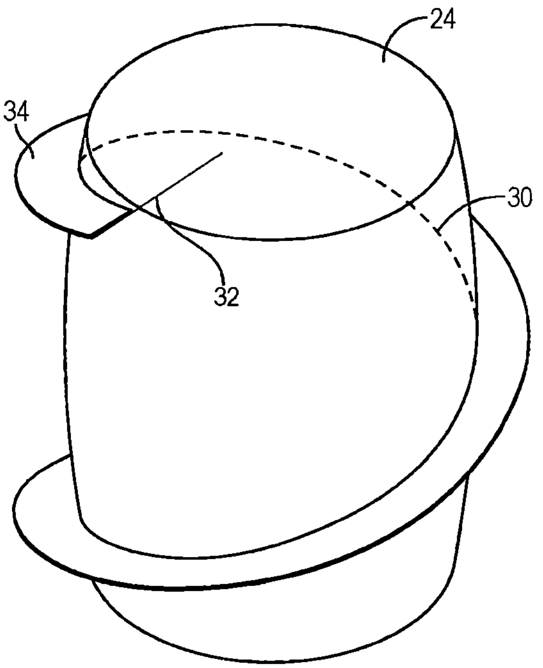
FIG. 4 depicts an embodiment of generating an intersecting curve for generating the fragmentation device.

FIG. 4 depicts intersection line 30 generated by sweeping radial line 32 along helical path 28. Radial line 32 may be drawn on the previously generated sketch, or a new sketch may be generated for radial line 32. Radial line 32 may be drawn from a starting point of helical path 28 outwardly, radially, intersecting curved surface 26. Radial line 32 then may be swept along helical path 28 generating helical surface 34 that intersects with curved surface 26 as shown. Intersection line 30 may be generated along curved surface 26 where helical surface 34 intersects. In some embodiments, in some tools, convert entities option may be used to generate intersection line 30.

In some embodiments, intersection line 30 may be a first intersection line and a plurality of intersection lines may be generated for positioning plurality of fragment layers 20 on curved surface 26. Generating helical path 28 and intersection line 30 may be repeated as many times as desired for generating plurality of fragment layers 20 as shown in FIG. 1B. A second intersection line may be generated by generating a second helical path similarly to helical path 28 described above. However, second helical path starting angle may be offset by approximately fifteen degrees as shown in FIG. 7 to ensure that fragments in the first layer do not align with fragments in the second layer as shown in FIG. 1B. Fifteen degrees is exemplary, and any angle may be used based on the size, shape, and pitch angle of the fragments for each layer.

Figure 5A:
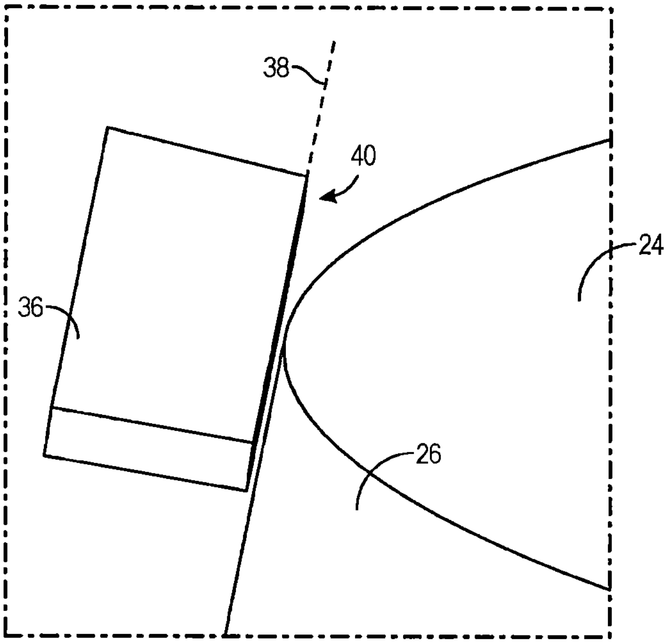
FIGS. 5A-5B depict an embodiment of generating a fragment for the fragmentation device.

FIG. 5A depicts fragment 36 positioned on intersection line 30 along tangent line 38. Fragment 36 may be generated along intersection line 30 with upper and lower edges of fragment 36 parallel to a tangent line 38 tangent to curved surface 26 and positioned at the center of fragment 36. Tangent line 38 may be generated tangent to the intersection line 30 and curved surface 26. As intersection line 30 is helical and the edges of fragment 36 are straight, generating tangent line 38 and aligning fragment 36 to tangent line 38 ensures a systematic method of placing fragments to provide a best fit for the plurality of fragments of the layer generated.

In some embodiments, a three-dimensional sketch may be generated with parallel lines for alignment of the sketch and fragment 36. Tangent line 38 may be generated tangent to curved surface 26 at the location that fragment 36 will be disposed. A plane may be created to represent inner surface 40 of fragment 36. As such, the plane should be generated to the desired dimensions of inner surface 40 of fragment 36. In some embodiments, tangent line 38 may be referenced as first tangent line and a second tangent line may align the pitch of fragment 36 with intersection line 30.

Figure 5B:
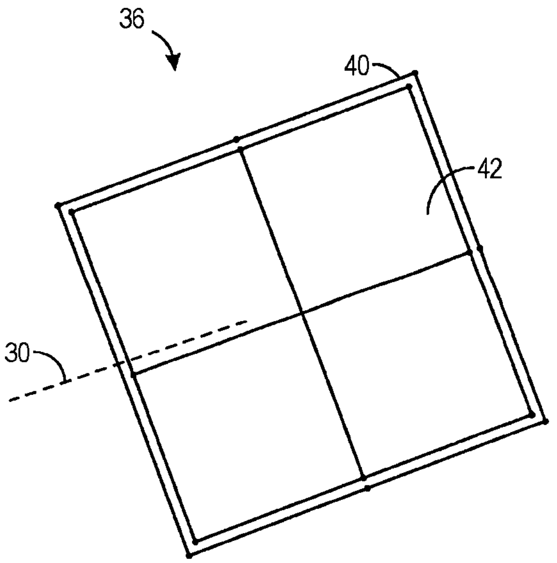

FIG. 5B depicts fragment 36 including a generated pitch and loft. Fragment loft may be created by generating a sketch on the previously generated plane with dimensions slightly larger than the dimensions of inner surface 40. In some embodiments, the outer dimensions may be slightly less. In some embodiments, the dimensions may have no change and may be generated with an extrude tool. Exemplary dimensions may be 0.10 millimeters larger on outer surface 42 upper and lower edges and 0.14 millimeters larger on the side edges of outer surface 42. When the sketch is offset a desired depth of fragment 36, the loft is defined. In fragment 36 as shown and described herein, the loft defines a cross-sectional increase in area the further from the center of fragmentation device 10; however, the loft may decrease, be various dimensions on each edge, or be any irregular shape from inner surface 40 to outer surface 42. The loft may also have no change in area, which could be generated by an extrude tool. The offset may generate fragment 36 with the desired loft and alignment to curved surface 26 and intersection line 30.

In some embodiments, fragment pitch may be generated by aligning fragment 36 with a second tangent line tangent to intersection line 30 defining a point at which fragment 36 is disposed. Second tangent line may be generated at the location where fragment 36 is disposed on first tangent line of curved surface 26. The upper and lower edges of fragment 36 may be constrained to be parallel with second tangent line tangent to intersection line 30. Therefore, upper and lower edges of fragment 36 may be parallel with intersection line 30 at the location where second tangent line intersects intersection line 30 and tangent line 38. As a result, fragment 36 may be aligned to curved surface 26 and intersection line 30.

Figure 6:
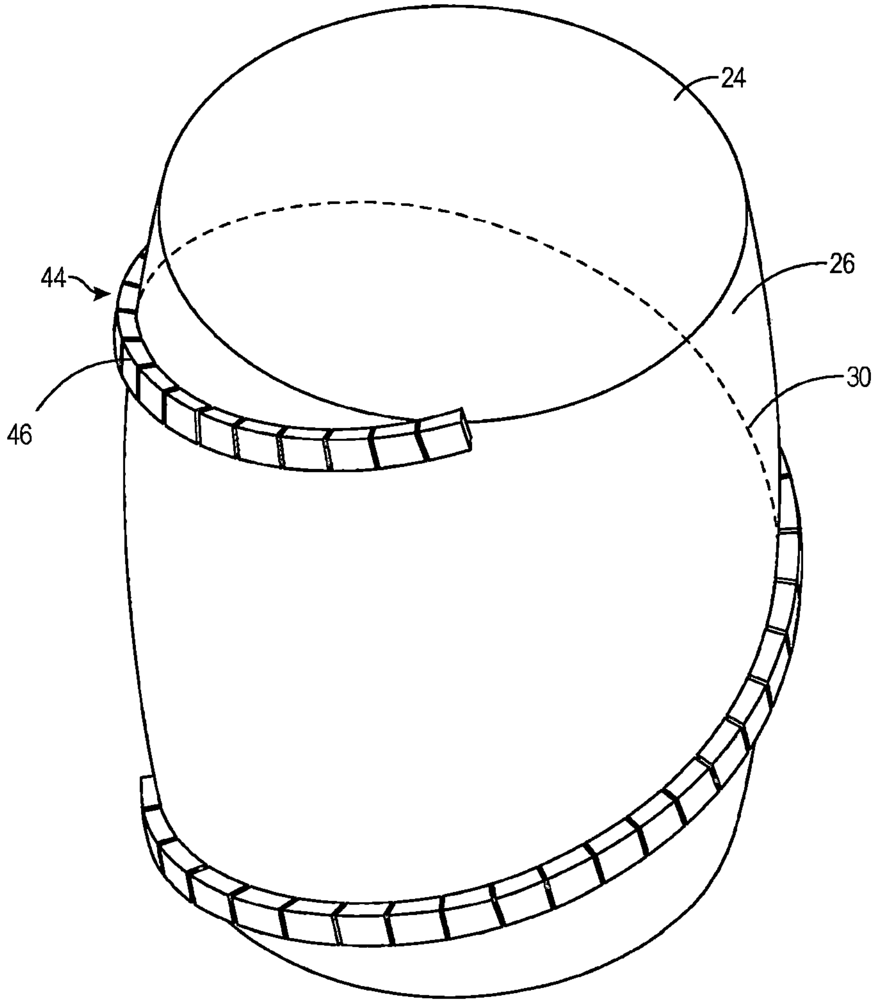
FIG. 6 depicts an embodiment of generating a plurality of fragments on the inner body.

FIG. 6 depicts plurality of fragments 46 positioned in curved pattern 44 along intersection line 30 on curved surface 26 of inner body 24. Each fragment of plurality of fragments 46 may be generated based on parameters assigned to curve pattern 44. For example, each fragment may be generated based on curved surface 26, intersection line 30, and fragment 36 at a location for each disposition of each fragment specified by the user. A position may be assigned to each fragment by selecting fragment 36 and assigning an offset value to place the next fragment in the curve pattern 44. A total number of fragments and a spacing value (e.g., equal spacing) may be assigned. Furthermore, tangencies to curved surface 26 and edges tangent to intersection line 30 may also be assigned. As a result, curved pattern 44 may be generated along, parallel to, and offset from intersection line 30, and tangent to curved surface 26. Furthermore, each fragment may be separated by equally assigned spaced (e.g., five millimeters) and to a specified total number of fragments that spans a desired height of inner body 24. In some embodiments, a curve driven pattern may be used to generate plurality of fragments 46 in the curve pattern 44 shown by defining the direction, number of fragments, spacing, curve, tangential properties described.

FIG. 7 depicts circular pattern 48, which is a first layer and second layer 50 of fragments. Second layer 50 is disposed at an offset distance from second intersection line and separated from curved surface 26 by the sum of the radius and the radial depth of the first layer. Furthermore, any additional spacing to separate the first layer and second layer 50 may be added as well as any tolerances necessary for manufacturing. Any number of layers may be added based on the number of intersection lines generated as described above.

In some embodiments, partial layer 21 may be generated. Partial layer 21 may be generated similarly to fragment layers 20 as in the processes described above. In some embodiments, geometry of partial layer 21 may be generated by the above-described process then employing a revolve cut feature to cut partial layer 21 to the surrounding geometry. Therefore, the geometry of partial layer 21 matches the contour of the surrounding layers.

In some embodiments, when the geometry of fragmentation device 10 is complete, the geometry may be stored as instructions in a single or plurality of part files for additive manufacturing.

As described in embodiments above, the helix pitch may be constant; however, in some embodiments, the helix pitch may be variable. A relationship between helix pitch and curvature of inner body may be defined such that as the curvature changes, the helix pitch changes. This allows for variable curvatures of curved surface while still optimizing fragment density.

In some embodiments, the spaces between fragments 12 may be patterned rather than the fragments 12. When the spaces are patterned, the fragments 12 are allowed to morph slightly to fit the spacing. This allows tight packing of fragments 12 when the radius and wall thickness is variable, and layers may be relatively thick.

Although the invention has been described with reference to the embodiments illustrated in the attached drawing figures, it is noted that equivalents may be employed, and substitutions made herein without departing from the scope of the invention as recited in the claims.

Having thus described various embodiments of the invention, what is claimed as new and desired to be protected by Letters Patent includes the following:

1. A fragmentation device created by a process, the process comprising:

generating a three-dimensional inner body comprising a three-dimensional convex cylinder comprising curvature in three orthogonal directions;

generating an intersection line that traces a helical path along an outer surface of the three-dimensional convex cylinder;

generating a three-dimensional fragment comprising an inner surface tangent to the three-dimensional convex cylinder at a point, wherein the inner surface comprises an inner surface area, wherein the three-dimensional fragment further comprises:

the outer surface comprising an outer surface area, wherein the inner surface corresponds to an interior of the fragmentation device proximal to the three-dimensional convex cylinder and the outer surface corresponds to an exterior of the fragmentation device distal to the three-dimensional convex cylinder; and a loft defined by the outer surface area being greater than the inner surface area;

aligning at least one edge of the three-dimensional fragment parallel with the intersection line at the point, wherein the three-dimensional fragment comprises at least one right angle between two adjacent edges;

generating, from a start angle, a three-dimensional helical pattern of the three-dimensional fragments on the three-dimensional convex cylinder along the intersection line, wherein each three-dimensional fragment of the three-dimensional helical pattern of the three-dimensional fragments is based on a fragment geometry of the three-dimensional fragment;

generating a three-dimensional layer of the three-dimensional fragments around the three-dimensional convex cylinder from the three-dimensional helical pattern of the three-dimensional fragments;

storing a geometry of the fragmentation device as computer-readable instructions to be manufactured by additive manufacturing; and forming the fragmentation device by the additive manufacturing according to the computer-readable instructions.

2. The fragmentation device of claim 1, wherein the three-dimensional layer of the three-dimensional fragments is a first layer of three-dimensional fragments comprising a first helical pattern generated from the start angle, wherein the process further comprises generating a second layer of three-dimensional fragments over the first layer of three-dimensional fragments, wherein the second layer comprises a second helical pattern aligned at an angle to the first helical pattern, and wherein each three-dimensional fragment of the second layer of the three-dimensional fragments is disposed over a space between each three-dimensional fragment of the first layer of three-dimensional fragments.

3. The fragmentation device created by the process of claim 1, the process further comprising:

generating at least one helical path with a specified pitch; and generating the intersection line along the three-dimensional convex cylinder by sweeping a radial line that intersects the three-dimensional convex cylinder along the helical path.

4. The fragmentation device created by the process of claim 1, wherein a shape of the three-dimensional convex cylinder is based at least in part on an expansion device to be disposed inside of the fragmentation device, wherein a size and a shape of the three-dimensional fragment and the curvature of the three-dimensional convex cylinder is based on a ballistic simulation.

5. The fragmentation device created by the process of claim 1, wherein a spacing between each three-dimensional fragment of the three-dimensional helical pattern of the three-dimensional fragments is five millimeters.

6. The fragmentation device created by the process of claim 1, the process further comprising defining a mathematical relationship between a pitch of the helical path and the three-dimensional convex cylinder, wherein the pitch of the helical path is variable.

7. A fragmentation device created by a process, the process comprising:

generating a three-dimensional inner body comprising a three-dimensional convex cylinder comprising curvature in three orthogonal directions;

generating at least one helical path with a first pitch;

generating an intersection line along the three-dimensional convex cylinder tracing the at least one helical path with the first pitch through the three orthogonal directions;

generating a three-dimensional fragment comprising a fragment inner surface tangent to the three-dimensional convex cylinder at a point, wherein the fragment inner surface comprises an inner surface area, wherein the three-dimensional fragment further comprises:

a fragment outer surface comprising an outer surface area, wherein the fragment inner surface corresponds to an interior of the fragmentation device proximal to the three-dimensional convex cylinder and the fragment outer surface corresponds to an exterior of the fragmentation device distal to the convex cylinder; and a loft defined by the outer surface area being greater than the inner surface area;

aligning at least one edge of the three-dimensional fragment parallel with the intersection line at the point, wherein the three-dimensional fragment comprises at least one right angle between two adjacent edges;

generating a three-dimensional helical pattern of the three-dimensional fragments from the three-dimensional fragment along the intersection line, wherein each three-dimensional fragment of the three-dimensional helical pattern of the three-dimensional fragments is based on a fragment geometry of the three-dimensional fragment;

generating a three-dimensional layer of the three-dimensional fragments comprising a circular pattern of the three-dimensional fragments from the three-dimensional helical pattern of the three-dimensional fragments on the three-dimensional convex cylinder;

storing a geometry of the fragmentation device as computer-readable instructions to be manufactured by additive manufacturing; and forming the fragmentation device by additive manufacturing according to the computer-readable instructions.

8. The fragmentation device created by the process of claim 7, the process further comprising generating the intersection line along the three-dimensional convex cylinder by sweeping a radial line that intersects the three-dimensional convex cylinder along the at least one helical path.

9. The fragmentation device created by the process of claim 8, wherein the radial line is generated in two dimensions then swept in three dimensions to generate the intersection line.

10. The fragmentation device created by the process of claim 7, wherein a radius associated with the three-dimensional convex cylinder of the three-dimensional inner body is variable.

11. A fragmentation device created by a process, the process comprising:

generating a three-dimensional inner body comprising a three-dimensional convex cylinder comprising curvature in three orthogonal directions;

generating an intersection line that traces a helical path along the three-dimensional convex cylinder;

generating a three-dimensional fragment comprising a fragment inner surface tangent to the three-dimensional convex cylinder at a point, wherein the fragment inner surface comprises an inner surface area, wherein the three-dimensional fragment further comprises:

a fragment outer surface comprising an outer surface area, wherein the fragment inner surface corresponds to an interior of the fragmentation device proximal to the three-dimensional convex cylinder and the fragment outer surface corresponds to an exterior of the fragmentation device distal to the three-dimensional convex cylinder; and a loft defined by the outer surface area being greater than the inner surface area;

aligning at least one edge of the fragment parallel with the intersection line at the point, wherein the three-dimensional fragment comprises at least one right angle between two adjacent edges;

generating a three-dimensional helical pattern of the three-dimensional fragments from the three-dimensional fragment along the intersection line, wherein the three-dimensional helical pattern of the three-dimensional fragments is aligned at a start angle and each three-dimensional fragment of the three-dimensional helical pattern of the three-dimensional fragments is based on a fragment geometry of the three-dimensional fragment;

generating a three-dimensional layer comprising a circular pattern of the three-dimensional fragments from the three-dimensional helical pattern of the three-dimensional fragments on the three-dimensional convex cylinder;

storing a geometry of the fragmentation device as computer-readable instructions to be manufactured by additive manufacturing; and forming the fragmentation device by additive manufacturing according to the computer-readable instructions.

12. The fragmentation device created by the process of claim 11, wherein a pitch of the helical path is constant and a shape, size, and spacing of the three-dimensional fragments is defined by a user.

13. The fragmentation device created by the process of claim 11, wherein the process further comprises generating the intersection line along the three-dimensional convex cylinder by sweeping a radial line that intersects the three-dimensional convex cylinder along the helical path.

14. The fragmentation device created by the process of claim 11, the process further comprising defining a mathematical relationship between a pitch of the helical path and the three-dimensional convex cylinder, wherein the pitch of the helical path is variable.

15. The fragmentation device created by the process of claim 1, wherein the three-dimensional layer is a first layer comprising a first start angle, wherein the process further comprises:

generating a second layer over the first layer, wherein the second layer comprises a second start angle, and wherein the second start angle is offset from the first start angle to provide first layer fragments of the first layer at an angular offset to a second layer fragments of the second layer.

16. The fragmentation device created by the process of claim 15, wherein the first start angle is opposite the second start angle.

17. The fragmentation device created by the process of claim 1, the process further comprising a first pitch of each first layer fragment and second pitch of each second layer fragment, wherein the first pitch and the second pitch are distinct.

18. The fragmentation device of claim 17, wherein the first pitch and the second pitch are opposite.

19. The fragmentation device of claim 1, wherein each three-dimensional fragment maintains a same distance between each adjacent three-dimensional fragment along a fragment height based on the loft.

20. The fragmentation device of claim 1, wherein an upper edge and a lower edge opposite the upper edge are parallel to the intersection line and the three-dimensional fragment comprises four right angles.

* * * * *